United States Patent [19]
Whaley et al.

[11] Patent Number: 6,002,988
[45] Date of Patent: Dec. 14, 1999

[54] METHOD FOR OPTIMIZING THE MAGNETIC FIELD OF A PERIODIC PERMANENT MAGNET FOCUSING DEVICE

[75] Inventors: David Riley Whaley, Chicago; Carter Michael Armstrong, Kildeer, both of Ill.

[73] Assignee: Northrop Grumman Corporation, Los Angeles, Calif.

[21] Appl. No.: 09/001,328

[22] Filed: Dec. 30, 1997

[51] Int. Cl.$^6$ .................................................. H01J 23/08
[52] U.S. Cl. .............................. 702/57; 702/66; 702/115; 702/183; 315/3.5; 315/5.35
[58] Field of Search ................................. 702/57, 66, 67, 702/69–71, 73, 115, 153, 182, 183; 313/153–162; 364/823, 838, 578; 315/5.35, 3.5; 330/43, 45; 324/244, 244.1, 246–253, 256–259, 260–263, 200–202, 204–206, 210, 216, 219, 220, 228, 232, 237, 238, 240; 395/500.27, 500.28

[56] References Cited

U.S. PATENT DOCUMENTS

| | | | |
|---|---|---|---|
| 4,032,922 | 6/1977 | Provencher | 343/854 |
| 4,137,482 | 1/1979 | Caryotakis et al. | 315/3.5 |
| 4,216,475 | 8/1980 | Johnson | 343/100 |
| 4,392,078 | 7/1983 | Noble et al. | 315/4 |
| 4,829,276 | 5/1989 | Leupold et al. | 335/306 |
| 4,959,559 | 9/1990 | Ziolkowski | 307/425 |
| 5,092,780 | 3/1992 | Vlach | 434/433 |
| 5,162,697 | 11/1992 | Davis et al. | 315/3.6 |
| 5,332,948 | 7/1994 | True et al. | 315/3.5 |
| 5,334,910 | 8/1994 | Karsten et al. | 315/5.35 |
| 5,394,346 | 2/1995 | Milsom | 364/578 |

OTHER PUBLICATIONS

Kondrashov et al., 3–D Plasma Armature Railgun Simulations, IEEE Transactions on Magnetics, vol. 31, No. 1, pp. 634–639, Jan. 1995.

*Primary Examiner*—Hal Wachsman
*Attorney, Agent, or Firm*—Terry J. Anderson; Karl J. Hoch, Jr.

[57] ABSTRACT

In accordance with the present invention, there is provided a method of profiling a total vector potential field of a periodic permanent magnetic field structure, wherein desired elements of the total vector potential field are known. The magnetic field structure comprises a plurality of magnets having individual vector potential fields which collectively form the total vector potential field. The method provides for using an electromagnetic solver to generate data files representative of each individual magnet's contribution to the total vector potential field. Such data files are generated by assuming a magnetization value of one unit for a selected magnet, setting magnetization values of zero for all other magnets, setting the electromagnetic solver to use high resolution proximate the selected magnet and to use low resolution elsewhere, using the electromagnetic solver to compute the individual vector potential fields for all space for which the total vector potential field is to be profiled, and repeating such steps for each magnet of the plurality of magnets to generate the data files. The method further provides for using the data files to determine magnetization values for each magnet necessary to provide the desired elements of the total vector potential field, and using the determined magnetization values to superimpose the individual vector potential fields to determine the total vector potential field.

3 Claims, 6 Drawing Sheets

METHOD FOR OPTIMIZING THE MAGNETIC FIELD OF A PERIODIC PERMANENT MAGNET FOCUSING DEVICE

FIELD OF THE INVENTION

The present invention relates generally to magnetic focusing and more particularly to a method for optimizing the magnetic field of a periodic permanent magnet (PPM) focusing device such as a traveling wave tube (TWT).

BACKGROUND OF THE INVENTION

The focusing and confinement of charged particle beams, e.g., those comprised of electrons, protons, ions, etc, for use in various different applications is well known. Such charged particle beams are commonly utilized in cathode ray tubes, charged particle accelerators, x-ray/gamma ray generators, etc.

More particularly, traveling wave tubes (TWT's) commonly use periodic permanent magnet (PPM) focusing and confinement systems. As those skilled in the art will appreciate, the use of such periodic permanent magnet focusing and confinement systems provides optimal utilization of the magnet material and thereby minimizes both the weight and cost of the traveling wave tube.

The weight of the magnet material required in such periodic focusing devices is substantially less than that required for a straight-field magnet since the leakage fields thereof are confined to a diameter comparable to the magnet period, rather than to the entire length of the magnet, as would be the case for a straight-field magnet. As those skilled in the art will appreciate, the quantity of magnetic material required in such application is directly proportional to the volume of the space which must be filled by the resultant magnetic field.

The use of periodic focusing is well known in the art. The practice of such periodic focusing utilizes a magnetic field which is symmetrical about the beam axis and which periodically reverses in direction. Thus, the magnetic field functions as a series of convergent magnetic lenses which overcome the tendency of the electron beam to diverge under the influence of forces due to its own space-charge.

Moreover, the increasing need for light weight radars, such as those which may be utilized in automobiles, missiles, remotely piloted vehicles, etc. has increased the need for traveling wave tubes having lower weights.

Thus, according to contemporary methodology, a traveling wave tube generally comprises a plurality of magnets configured as short, hollow cylinders (washers) which are magnetized axially in alternating directions so as to form a periodic magnetic field. Typically, iron pole-piece washers are positioned between adjacent magnets so as to concentrate the flux thereof in the volume occupied by the electron beam.

Knowledge of the full magnetic field structure generated by such periodic permanent magnet focusing and confinement systems is frequently required so as to facilitate accurate modeling of the electron beam propagation therein and also so as to facilitate optimization of the focusing and confinement system. Thus, proper modeling and optimization of the magnetic field is essential to the successful design of high performance vacuum electronic devices employing periodic permanent magnetic focusing and confinement.

Although it is possible to attempt optimization of the magnetic field for use in periodic permanent magnet focusing and confinement systems via trial and error, such an iterative process is extremely time consuming and does not guarantee the desired level of optimization. Such a trial and error approach to magnetic field optimization involves making subtle changes to the magnetization level of one or more of the magnets of a periodic permanent magnetic system and then using an electromagnetic solver such as MAXWELL, by Ansoft Corporation of Pittsburgh, Pa.

However, as those skilled in the art will appreciate, such an iterative approach may be extremely time consuming because of the non-intuitive magnetization required to provide the desired resultant magnetic field. As such, it is desirable to provide a means for calculating the required magnetization of each magnet of a periodic permanent magnetic system so as to provide the desired resultant total magnetic field.

SUMMARY OF THE INVENTION

The present invention specifically addresses and alleviates the above mentioned deficiencies associated with the prior art. More particularly, the present invention comprises a method for profiling the magnetic fields of periodic permanent magnetic field structures. The method comprises the steps of using an electromagnetic solver, such as Maxwell, to generate data files representative of each individual magnet's contribution to the total vector potential field. The magnetization values are determined for each magnet which is necessary to provide the desired total magnetic field. Individual vector potential fields are superimposed to form the total vector potential field.

The step of using an electromagnetic solver to generate data files representative of each individual magnet's contribution to the total vector potential field comprises assuming unit magnetization for a given magnet and setting the magnetization values for all other magnets to zero. The electromagnetic solver is then configured so as to use high resolution proximate the selected magnet and so as to use low resolution everywhere else. The electromagnetic solver is used to compute vector potential for all space for which the magnetic field is to be profiled. This process is repeated for each magnet of the periodic permanent magnets so as to generate the data files.

According to the preferred embodiment of the present invention, the step of determining the magnetization values for each magnet necessary to provide the desired total magnetic field comprises the steps of using the data files to form a coupling matrix, calculating a determinant of the coupling matrix, inverting the coupling matrix when the determinant is not equal to zero, and calculating the magnetization of each magnet required to provide the desired magnetic field.

Further, according to the preferred embodiment of the present invention, the step of superimposing individual vector potential fields to form a total vector potential field comprises superimposing weighted vector potential fields.

According to the methodology of the present invention, a periodic magnetic field structure is optimized. Thus, devices such as traveling wave tubes may be constructed in a manner which most efficiently guides an electron beam from a gun or source to its intended target.

These, as well as other advantages of the present invention will be more apparent from the following description and drawings. It is understood that changes in the specific structures shown and described may be made within the scope of the claims without departing from the spirit of the invention.

DETAILED DESCRIPTION OF THE PREFERRED INVENTION

The detailed description set forth below in connection with the appended drawings is intended as description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Although described herein as applied to a traveling wave tube, those skilled in the art will appreciate that the methodology of the present invention is likewise suitable for use with various different devices employing periodic permanent magnet (PPM) focusing. Thus, the discussion of the present invention as applied to a traveling wave tube is by way of illustration only and not by way of limitation.

Figure 1:
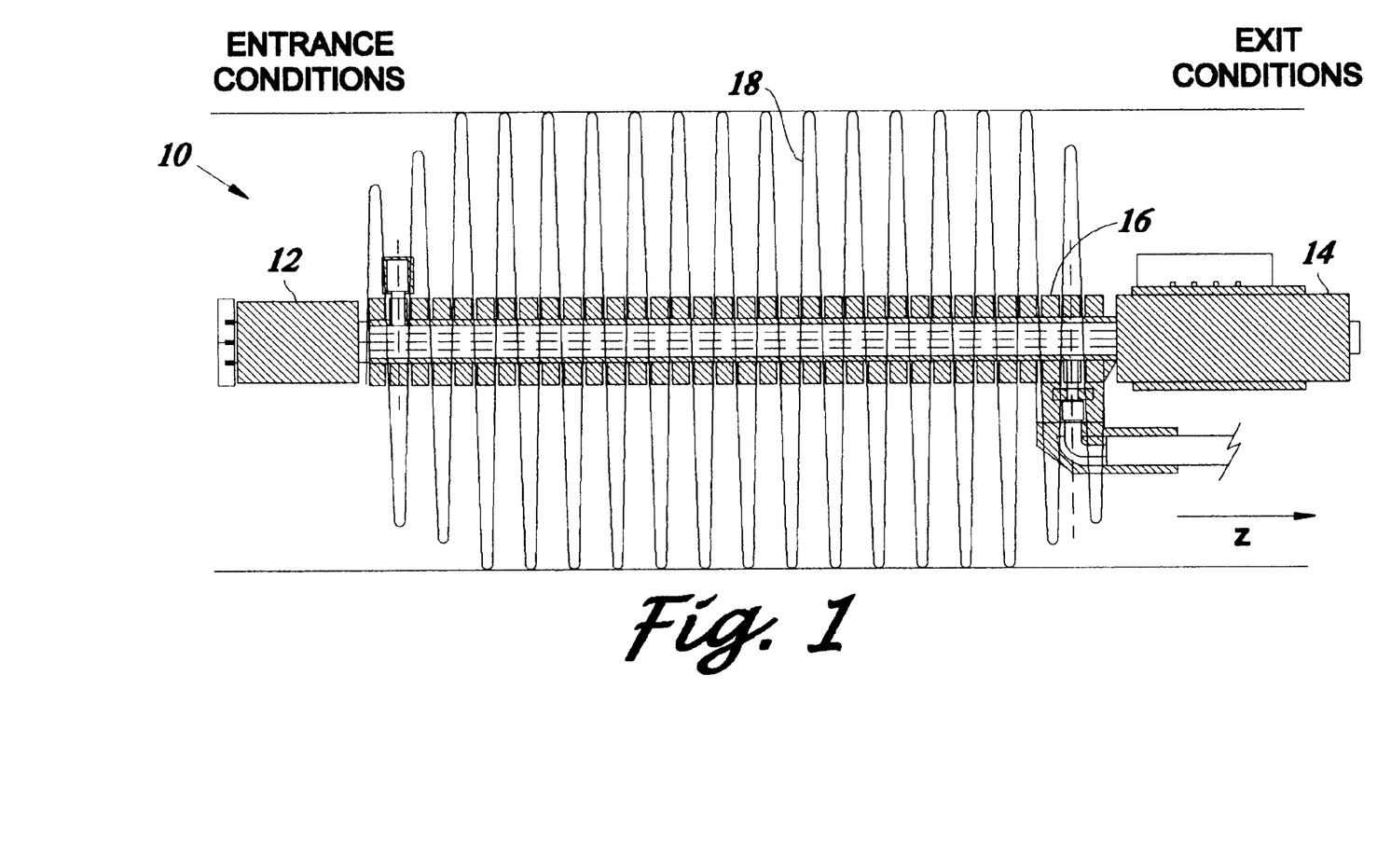
FIG. 1 shows a traveling wave tube having a periodic permanent magnetic field structure for guiding the electron beam from the electron gun to the collector thereof, and also shows the on-axis magnetic field profile provided by the periodic permanent magnetic field structure.

Referring now to FIG. 1, a contemporary traveling wave tube 10 typically comprises a gun 12 for generating an electron beam, a target or collector 14 for receiving the electron beam generated by the gun 12, and a periodic permanent magnet field structure comprised of a plurality of individual permanent magnets 16.

As those skilled in the art will appreciate, the individual magnets 16 of the periodic permanent magnetic field structure generate an on-axis magnetic field 18 which alternates in polarity along the z-axis of the electron beam. The exact polarity of each magnetic field is arbitrary (as long as all of the peaks have the same polarity and all of the troughs have the same polarity), but for this discussion we can assume that the peaks of the field 18 are positive and the troughs are negative. As described above, the magnets 16 of the traveling wave tube are generally configured as short, hollow cylinders or washers which are magnetized axially in alternating directions so as to form the periodic magnetic field. Typically, iron pole-piece washers 17 (better shown in FIG. 5) are positioned between adjacent magnet 16 so as to concentrate the flux of the magnet 16 in the volume occupied by the electron beam.

Thus, focusing and confinement of the electron beam is provided via the periodic permanent magnetic field structure. As those skilled in the art will appreciate, knowledge of the complete magnetic field structure generated by the magnets 16 of the periodic permanent magnetic field structure is required in order to model the electron beam propagation thereon. Proper modeling and optimization of the magnetic field is essential to the successful design of such high performance vacuum electronic devices employing periodic permanent magnet (PPM) focusing.

According to the preferred embodiment of the present invention a 36 cell (each cell comprising one permanent magnet 16) periodic permanent magnet (PPM) stack traveling wave tube 10 is provided. As mentioned above, the electron beam generated by the gun 12 is focused and confined as it propagates toward the target or collector 14. The periodic permanent magnetic field structure surrounds the z-axis of the traveling wave tube. Each individual magnet 16 of the periodic permanent magnetic field structure is independently magnetized to a predetermined value.

The computation of either a partial or full solution of the magnetic field structure of the periodic permanent magnet field structure requires the use of an electromagnetic solver, typically using a finite element approach to arrive at a solution of the equations governing the vector potential from which the magnetic field is computed. All of the properties of the materials in the problem must be known and the magnetization of the magnets in each of the cells must also be known. The density of the mesh which is required to achieve an accurate solution depends upon the radius of the field in the region under consideration. As those skilled in the art will appreciate, the density of the mesh greatly affects the required computation time of the electromagnetic solver program.

As shown in FIG. 1, the magnetic field of the periodic permanent magnetic field structure oscillates rapidly at different positions along the z direction, thereby creating very high spatial gradients which are difficult to resolve unless excessively small mesh sizes are used in the electromagnetic solver in order to accurately model the structure. Although the peak value of the magnetic field along the periodic permanent magnetic field structure is an analytic quantity, the profiling of the magnetic field at the input and output must be determined through optimization techniques. Such optimization is required at the input to create a laminar electron beam in the periodic permanent magnetic field structure so as to achieve efficient interaction of the electron beam therewith and also so as to provide desired focusing properties. Optimization is similarly required at the output of the periodic permanent magnetic field structure in order to achieve efficient re-collection of the spent electron beam energy.

Figure 2:
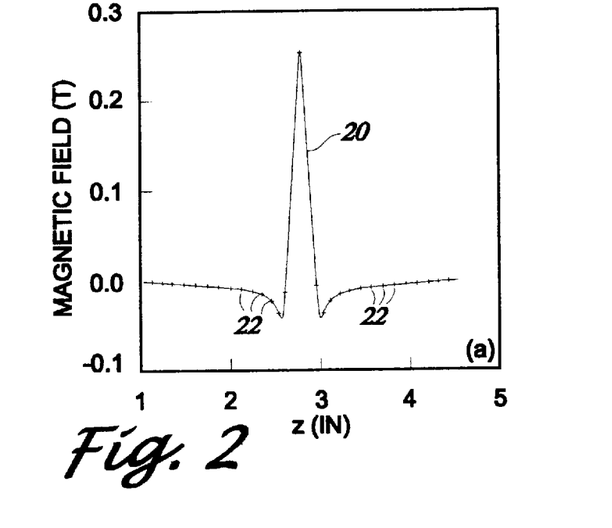
FIG. 2 is a plot of the on-axis magnetic field due to a single magnet of a periodic permanent magnetic field structure wherein the x's show the location of the centers of adjacent magnets.
Figure 3:
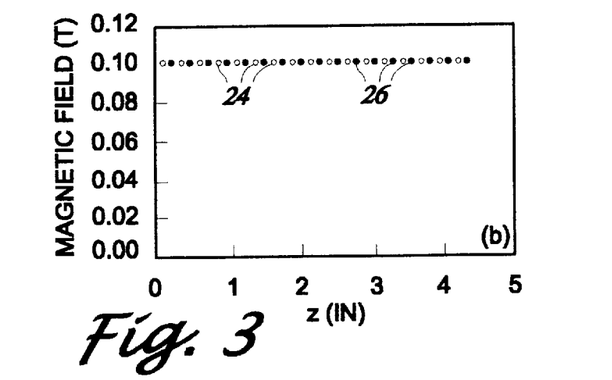
FIG. 3 is a plot showing the desired magnetic field at the centers of the individual magnetics of the periodic permanent magnetic field structure for a simple constant profile wherein the white circles indicate a positive field and the black circles indicate a negative field.
Figure 4:
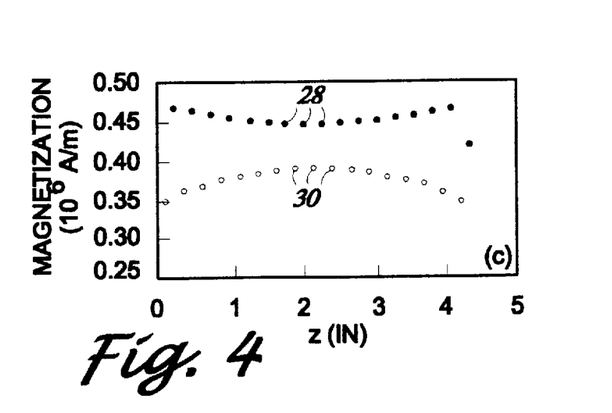
FIG. 4 is a plot showing the actual magnet ring magnetization required to achieve the target magnet field profile shown in FIG. 3.

Referring now to FIGS. 2–4, the difficulty in determining the magnetization values of each of the individual magnets required to generate a desired field profile is discussed. With particular reference to FIG. 2, the magnetic field along the z axis as a result of unit magnetization of a single cell of the periodic permanent magnetic 16 field structure is shown. The crosses on the plot show the locations of the cell centers of adjacent magnets 16. It is clear from the plot that the magnet cells are coupled to one another and that the total magnetic field at any given location is due to contributions from other nearby magnets 16. That is, the magnetic field proximate a given magnet is due not only to that magnet, but also due to nearby magnets 16, as well.

With particular reference to FIG. 3, the desired magnetic field at the cell centers of the periodic permanent magnetic field structures, i.e., along the z axis of the traveling wave tube, are shown. The white circles indicate a positive magnetic field and the black circles indicate a negative magnetic field. As shown in FIG. 3, a constant magnetic field is desired at the center of each magnet cell.

As shown in FIG. 4, the required magnetization values for providing the desired profile of FIG. 3 are wholly unintuitive. As those skilled in the art will appreciate, trial and error attempts to generate the simple flat magnetic field profile of FIG. 3 would require an extremely large amount of time, with little likelihood of arriving at an acceptable solution. Further, since the entire periodic permanent magnetic field structure must be solved at each iterative step utilizing large field gradients, and the consequent fine mesh size, the computation time required for an accurate solution is prohibitively large. Subsequent modifications in the profile for optimization purposes are extremely difficult to achieve.

However, according to the methodology of the present invention, rapid and accurate generation of the vector potential data required in order to achieve a desired arbitrary magnetic field profile, such as that necessary for the electron optics of a traveling wave tube, is provided. Thus, the substantially flat magnetic profile of FIG. 3, as well as any variation of this profile, may be provided by the present invention. Thus, the required cell magnetization values are determined and the total field is rapidly and accurately computed for all volume occupied by the electron beam. The methodology of the present invention thus facilitates the generation of accurate magnetic field profiles, including all off-axis components thereof. Once the initial data required for the method is generated, the computation time required to provide such results is reduced from a matter of days to a matter of minutes.

Figure 5:
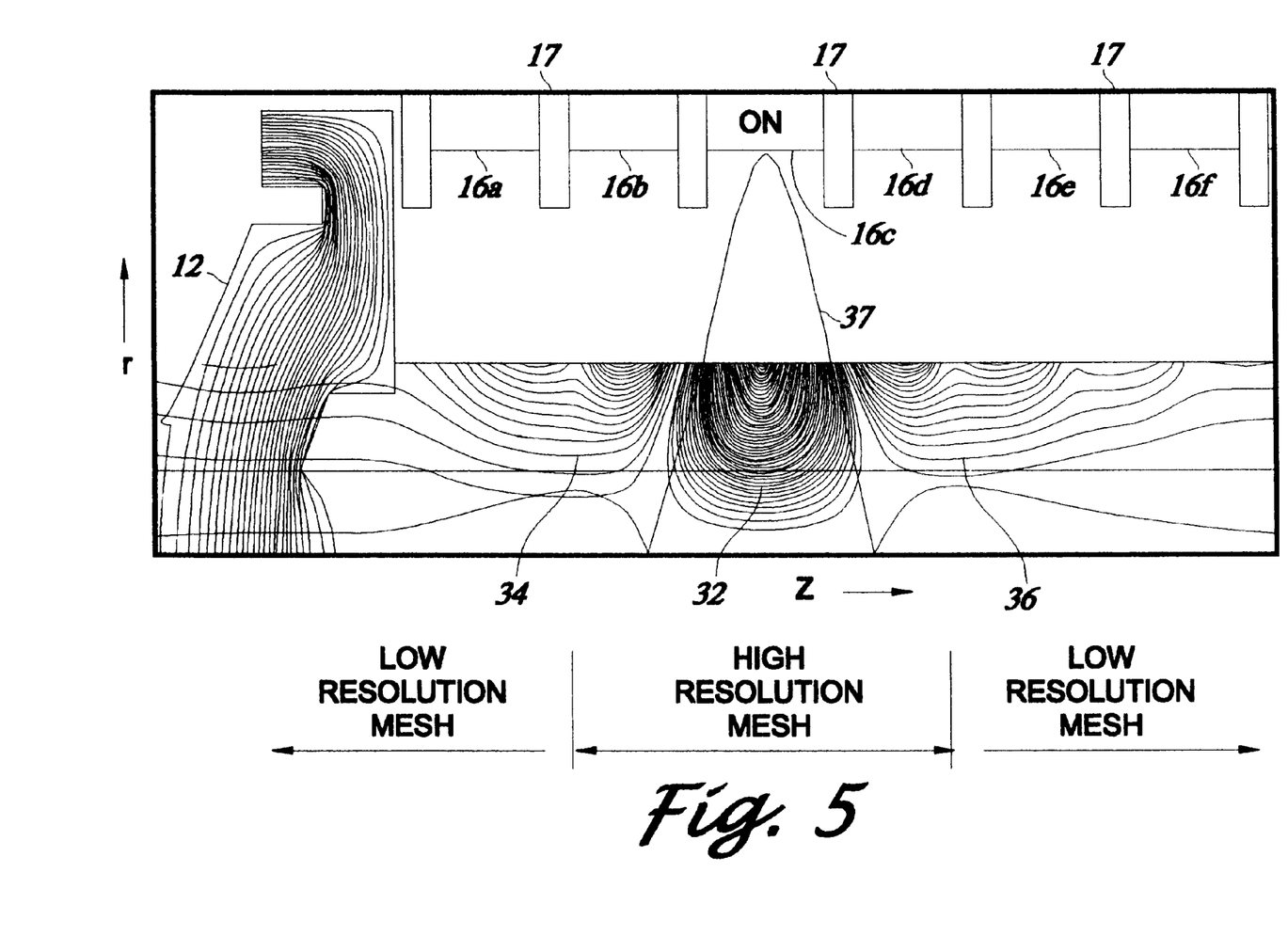
FIG. 5 is a cross section of the upper portion of the gun side of the traveling wave tube of FIG. 1, showing six permanent magnets and also showing a calculation of the vector potential for a single magnet, i.e., the third magnet from the left, and also showing the on-axis magnetic field produced thereby as well as the regions where high resolution and low resolution are desired according to the present invention.

Referring now to FIG. 5, an enlarged view of the upper portion of the left side of the traveling wave tube, including a portion of the electron gun 12 is shown. Six magnets 16a–16f, along with seven spacers 17 are shown. The third magnet 16c has been assigned unit magnetization of $1 \times 10^6$ A/m and is labeled ON in the figure. The magnetization value for all of the other magnets is set to zero. Also shown is the result of the electromagnetic solver which computes $A_\theta$ for the vector potential values in the space occupied by the electron beam due to the presence of the third magnet 16c. Flux lines or contours of constant $rA_\theta$, where r equals the radial position, are plotted in the FIG. 5 the computed on-axis magnetic Bz is also given. The magnetic field is computed from the vector potential $\underline{A}$ as follows:

$$\underline{B} = \underline{\nabla} \times \underline{A}. \quad (1)$$

The magnetic field plot of FIG. 5 shows that the magnetic field extends substantially to several cells on either side of the magnet 16c, which is turned on. However, the high gradients occur only in the region immediately proximate magnet 16c. Thus, the resolution of the electromagnetic solver may be set as shown in FIG. 5, wherein a high resolution mesh is utilized immediately proximate magnet 16c and low resolution meshes are utilized elsewhere. Thus, only in the volume directly surrounding the unit-magnetized cell is the resolution set to high. In all other space, which typically comprises approximately 90% of the total computation time, only a very course resolution is required. As those skilled in the art will appreciate, the resolution with which the electromagnetic solver performs computations greatly affects the computation time period. Thus, maintaining high resolution only where absolutely required provides a substantial decrease in the computation time.

The vector potential 32 immediately adjacent to the ON magnet 16c has a substantially greater gradient than the vector potentials 34, 36, to either side thereof. The magnetization value 37 is, of course, greatest proximate magnet 16c.

The computed vector potential data for the entire stack, as shown in FIG. 1, is saved to a data file for later use. This procedure is repeated for each magnet 16 of the periodic permanent magnetic field structure. The result is a set of N data files, each data file representing the response of the system to magnet N, charged with unit magnetization. After the data files have been generated by the electromagnetic solver, the electromagnetic solver is no longer required and the optimization of the present invention utilizes only the stored data files.

Thus, after the data sets have been stored, then for each cell Equation 1 is utilized to compute $B_{z\;ij}$=axial magnetic field at r=0, i.e., on axis, at z position i due to unit magnetization of cell j linearity is assumed, which is valid if the iron of the periodic permanent magnetic field structure stack does not approach saturation, thereby allowing the system to be written as:

$$B_i = A_{i1}M_1 + A_{i2}M_2 + \ldots + A_{ii}M_i = \ldots + A_{in}M_n \quad (2)$$

Equation 2 may be rewritten in matrix form as:

$$\underline{B} = \underline{\underline{A}}\underline{M} \quad (3)$$

where $\underline{B}$=nx1 vector of PPM stack center cell values
$\underline{\underline{A}}$=nxn coupling matrix
$\underline{M}$=nx1 vector of magnetization values
n=number of PPM stack cells where $\underline{A}$ takes the form:

$$\underline{\underline{A}} = \begin{bmatrix} A_{11} & \cdots & A_{1i} & \cdots & A_{1n} \\ \cdot & \cdot & & & \\ \cdot & & \cdot & & \\ \cdot & & & \cdot & \\ A_{i1} & & A_{ii} & & A_{in} \\ \cdot & & & \cdot & \\ \cdot & & & & \cdot \\ \cdot & & & & \\ A_{n1} & & A_{ni} & & A_{nn} \end{bmatrix} \quad (4)$$

The matrix A is the matrix of coupling coefficients where each column j of coefficients of $\underline{\underline{A}}$ is determined by the $B_{zij}$ values calculated above. Once the matrix $\underline{\underline{A}}$ is determined, the coupling equation, (Eq. 3), is rewritten as:

$$\underline{M} = \underline{\underline{A}}^{-1}\underline{B} \tag{5}$$

where:

$$\underline{M} = \begin{bmatrix} M_1 \\ \vdots \\ M_i \\ \vdots \\ M_n \end{bmatrix} \text{ AND } \underline{B} = \begin{bmatrix} B_1 \\ \vdots \\ B_i \\ \vdots \\ B_n \end{bmatrix} \tag{6}$$

The viability of Eq. 5 depends on the invertability of matrix $\underline{\underline{A}}$. If $$\det(\underline{\underline{A}}) \neq 0 \tag{7}$$

then the matrix $\underline{\underline{A}}$ can be inverted and Eq. 5 may be used. Though Eq. 7 should be verified numerically, for any physical system it will hold true.

Figure 6:
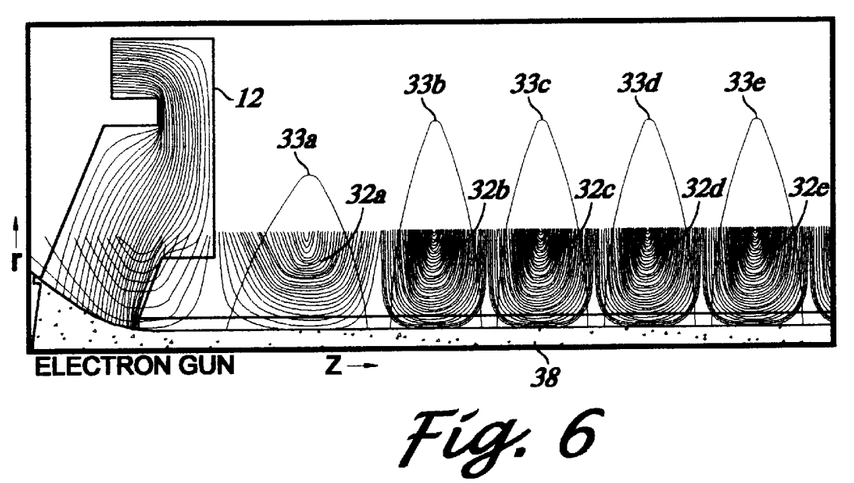
FIG. 6 shows substantially the same portion of the traveling wave tube to as FIG. 5, and also shows optimized magnetic field simulation of the traveling wave tube periodic permanent magnet field structure.

Now $\underline{B}$ is arbitrary and user-defined and the magnetization values, $\underline{M}$, of each of the ring magnets in the PPM stack required to create the on-axis profile defined by $\underline{B}$ are rapidly computed through Eq. 5. Once the magnetization values are known, one could return to the electromagnetic solver, use the magnetization vector to define the magnetization of each of the ring magnets, define a fine mesh for the entire volume of the PPM stack to compute the high gradient fields, and one would compute the fields yielding a profile defined by $\underline{B}$. This method however allows one to skip this step and proceed directly to the final solution using superposition defined by:

$$A_\theta(r,z) = \sum_{i=1}^{n} M_i A_{\theta i}(r,z) \tag{8}$$

where $M_i$ is defined by Eq. 5 and $A_{\theta i}$ are the data sets originally saved for unit magnetization of cell i. The result, $A_\theta$ (r,z), is then used for the electron optics simulation of the PPM stack. An example of an optimized field for the first five cells of a PPM stack is shown in FIG. 6. The laminar beam, shown clearly to be confined and well-focused, is dependent on the optimized profile shown in the figure. Though the example of FIG. 6 shows magnetic profiling in the gun region of a TWT, this procedure is also fully applicable, and has been used, in the collector region also to tailor the magnetic profile to optimize TWT collector efficiency. In practice, the PPM stack is built once the optimization is performed using the magnetization values $\underline{M}$, and the resulting profile $\underline{B}$. Good performance of TWT's is strongly dependent on this optimization. As stated earlier, once the initial data files are generated, the procedure to arrive at the result shown by Eq. 8 can be generated in a mere few minutes of computation time.

Referring now to FIG. 6, an optimized periodic permanent magnetic field structure is shown. The magnetization value 33a–33e for each of the magnets 16 (FIG. 1) provides vector potential fields 32a–32e which effect the formation of a substantially laminar electron beam 38, as desired.

Figure 7:
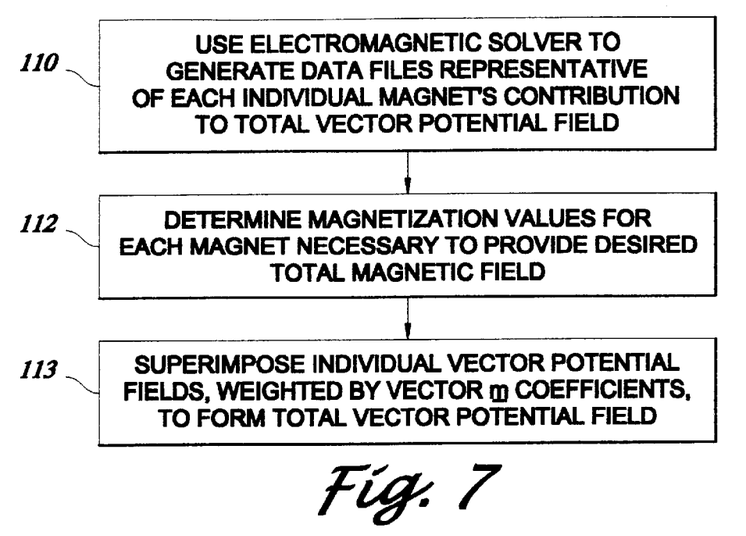
FIG. 7 is a flow chart showing an overview of the method for profiling the magnetic fields of periodic permanent magnet field structure according to the present invention.

Referring now to FIG. 7, according to the preferred embodiment of the present invention, the method for profiling the magnetic fields of periodic permanent magnetic field structure comprises the steps of using 110 an electromagnetic solver to generate data files representative of each individual magnet's contribution to the total vector potential field; determining 112 the magnetization values for each magnet necessary to provide the desired total magnetic field; and superimposing 113 individual vector potential field weighted by vector $\underline{M}$ coefficients, to form a total vector potential field.

Figure 8:
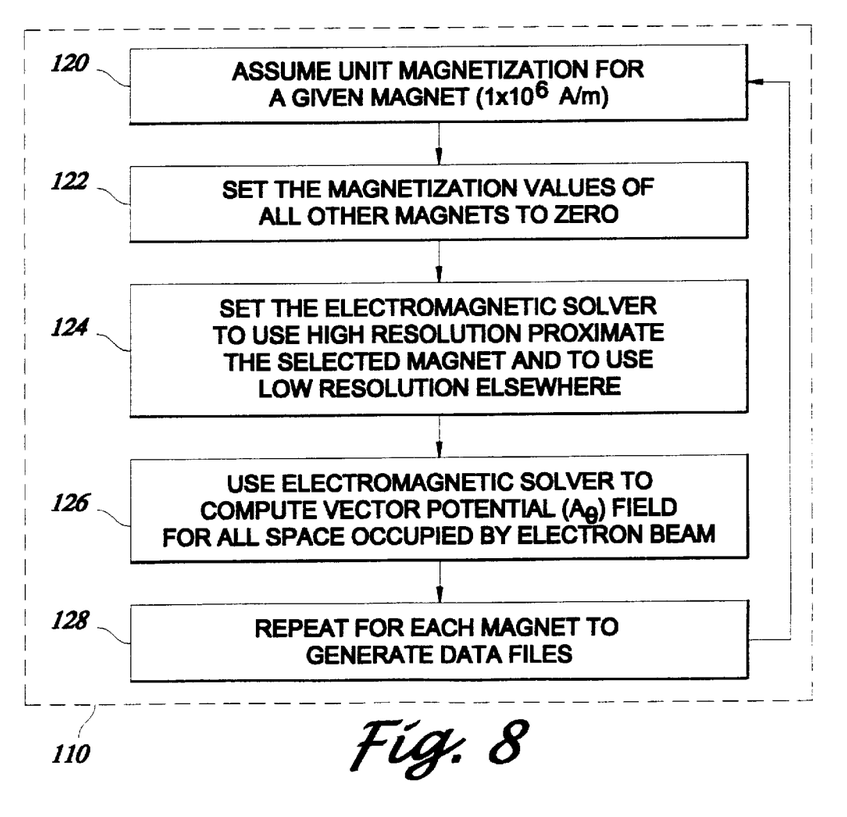
FIG. 8 is a flow chart showing the steps performed in the utilization of an electromagnetic solver to generate data files.

The step of using an electromagnetic solver to generate data files preferably comprises the steps of assuming 120 unit magnetization for a given magnet ($1 \times 10^6$ A/m); setting 120 to the magnetization values of all other magnets to zero; setting 124 the electromagnetic solver to use high resolution proximate the selected magnet and to use low resolution elsewhere; using 126 the electromagnetic solver to compute a vector potential ($A_\theta$ field for all space occupied by the electron beam); and repeating 128 this process for each magnet so as to generate data files therefore.

Figure 9:
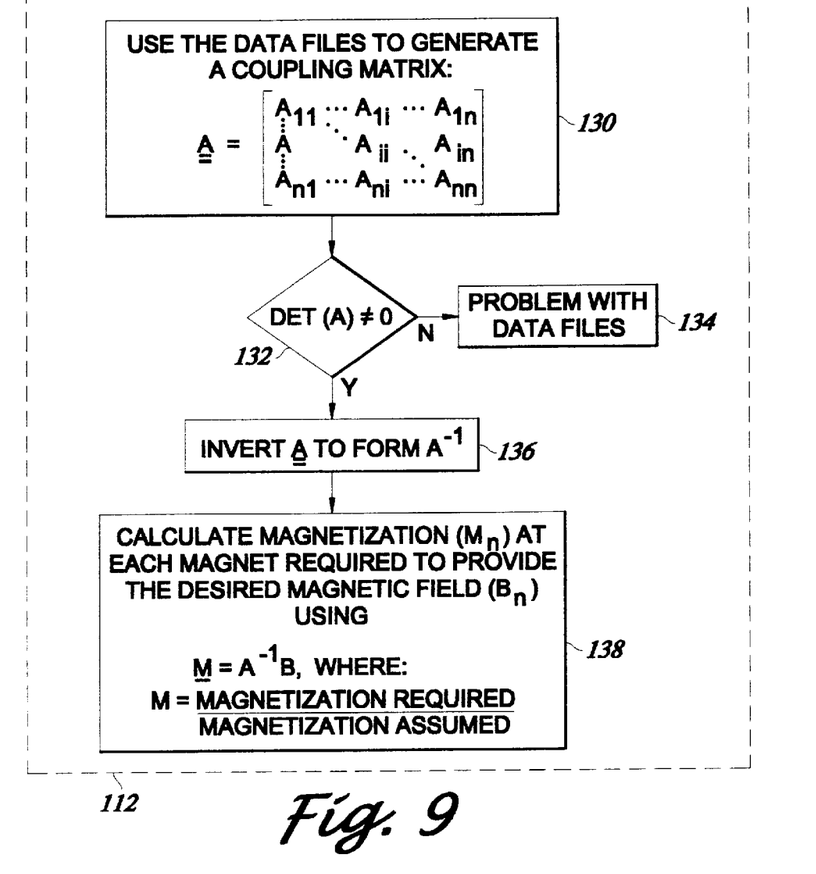
FIG. 9 is a flow chart showing the steps performed to determine the magnetization values for each magnet.

The step of determining 112 the magnetization values for each magnet preferably comprises the steps of using 130 the data files to generate a coupling matrix; determining 132 whether or not the determinant of the data matrix is equal to zero; inverting 136 the matrix $\underline{\underline{A}}$ to form $\underline{\underline{A}}^{-1}$; and calculating magnetization ($M_n$) at each magnet required to provide the desired magnetic field ($B_n$).

Figure 10:
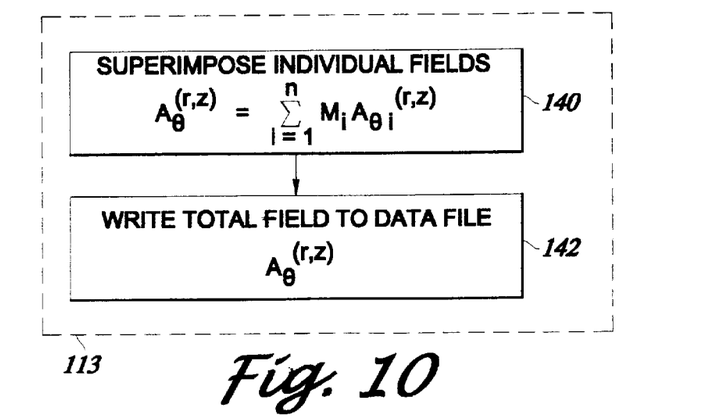
FIG. 10 is a flow chart showing the steps performed to superimpose individual vector potential fields.

The step of superimposing 113 individual vector potential fields preferably comprises superimposing 140 the individual vector fields according to formula 8 and writing the total field to a data file $A_\theta$ (r,z).

Thus, according to the method for profiling the magnetic fields of periodic permanent magnetic field structures of the present invention, a numerical procedure is provided for the modeling and optimization of a periodic permanent magnetic field structure's magnetic fields. The method of the present invention allows one to generate the actual vector potential fields corresponding to an arbitrarily determined magnetic field profile for use with electron beam optics computations. This procedure allows one to determine the magnetization values required for each of the ring magnets of the periodic magnetic field structure stack so as to generate the optimized magnetic field profiles. An extremely accurate value for the required magnetization of each magnet in the stack is generated without requiring a corresponding increase in computation time.

It is understood that the exemplary method for profiling the magnetic fields of periodic permanent magnetic field structures described herein and shown in the drawings represents only a presently preferred embodiment of the invention. Indeed, various modifications and additions may be made to such embodiment without departing from the spirit and scope of the invention. For example, the method of the present invention may be utilized in many other, different applications. Thus, these and other modifications and additions may be obvious to those skilled in the art and may be implemented to adapt the present invention for use in a variety of different applications.

What is claimed is:

1. A method of profiling a total vector potential field of a periodic permanent magnetic field structure, wherein desired elements of the total vector potential field are known, the magnetic field structure comprising a plurality of magnets, the magnets having individual vector potential fields which collectively form the total vector potential field, the method comprising the steps of:

a) using an electromagnetic solver to generate data files representative of each individual magnet's contribution to the total vector potential field, the step of using an electromagnetic solver comprising the steps of;

i) assuming a magnetization value of one unit for a selected magnet;

ii) setting magnetization values of zero for all other magnets;

iii) setting the electromagnetic solver to use high resolution proximate the selected magnet and to use low resolution elsewhere;

iv) using the electromagnetic solver to compute the individual vector potential fields for all space for which the total vector potential field is to be profiled;

v) repeating steps (i) through (iv) for each magnet of the plurality of magnets to generate the data files;

b) using the data files to determine magnetization values for each magnet necessary to provide the desired elements of the total vector potential field; and c) using the determined magnetization values to superimpose the individual vector potential fields to determine the total vector potential field.

2. The method as recited in claim 1, wherein step b) comprises the steps of:

a) using the data files to form a coupling matrix;

b) calculating a determinant of the coupling matrix;

c) inverting the coupling matrix when the determinant is not equal to zero; and    d) calculating the magnetization values at each magnet necessary to provide the desired elements of the total vector potential field.

3. The method as recited in claim 1, wherein step c) comprises superimposing the individual vector potential fields which are weighted based upon the magnetization values determined instead b).

* * * * *

UNITED STATES PATENT AND TRADEMARK OFFICE
CERTIFICATE OF CORRECTION

PATENT NO.   : 6,002,988
DATED        : December 14, 1999
INVENTOR(S)  : David R. Whaley and Carter M. Armstrong It is certified that error appears in the above-identified patent and that said Letters Patent is hereby corrected as shown below:

Column 1,
After the title insert the following:
This invention was made with Government Support under N00014-94-C-2242 awarded by the Department of the Navy. The Government has certain rights to this invention Signed and Sealed this Eighth Day of January, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

| | |
|---|---|
| PATENT NO. | : 6,002,988 |
| DATED | : December 14, 1999 |
| INVENTOR(S) | : David Riley Whaley and Carter Michael Armstrong |

Page 1 of 1

It is certified that error appears in the above-identified patent and that said Letters Patent is hereby corrected as shown below:

<u>Column 1,</u>
Line 4, insert the following:

-- STATEMENT OF GOVERNMENT RIGHTS

This invention was made with Government Support under contract N00014-94-C-2242 awarded by the United States Navy. The Government has certain rights in this invention. --

Signed and Sealed this

Twentieth Day of August, 2002

*Attest:*

*Attesting Officer*

JAMES E. ROGAN
*Director of the United States Patent and Trademark Office*